United States Patent
Masuda et al.

(10) Patent No.: US 11,550,210 B2
(45) Date of Patent: Jan. 10, 2023

(54) PROJECTING APPARATUS

(71) Applicant: MEGA1 COMPANY LTD., New Taipei (TW)

(72) Inventors: Makoto Masuda, New Taipei (TW); Wen-Chieh Wu, New Taipei (TW); Chang-Wei Huang, New Taipei (TW); Chia-Yu Chang, New Taipei (TW); Chih-Han Yen, New Taipei (TW); Chih-Yu Yang, New Taipei (TW)

(73) Assignee: MEGA1 COMPANY LTD., New Taipei (TW)

( * ) Notice: Subject to any disclaimer, the term of this patent is extended or adjusted under 35 U.S.C. 154(b) by 49 days.

(21) Appl. No.: 17/333,025

(22) Filed: May 28, 2021

(65) Prior Publication Data
US 2021/0373419 A1 Dec. 2, 2021

Related U.S. Application Data

(60) Provisional application No. 63/031,592, filed on May 29, 2020, provisional application No. 63/031,593, (Continued)

(51) Int. Cl.
*G03B 21/14* (2006.01)
*G02B 27/30* (2006.01)
(Continued)

(52) U.S. Cl.
CPC ............ *G03B 21/145* (2013.01); *B81B 7/008* (2013.01); *G02B 7/025* (2013.01);
(Continued)

(58) Field of Classification Search
CPC ...... G03B 21/008; G03B 21/14; G03B 21/16; G03B 21/28; G03B 21/145;
(Continued)

(56) References Cited

U.S. PATENT DOCUMENTS 6,647,172 B2 11/2003 Giles et al.
7,413,315 B2 8/2008 Davies et al.
(Continued)

FOREIGN PATENT DOCUMENTS

CN 1393710 A 1/2003
CN 104793451 A 7/2015
(Continued)

*Primary Examiner* — Sultan Chowdhury
(74) *Attorney, Agent, or Firm* — Li & Cai Intellectual Property Office

(57) ABSTRACT

A projecting apparatus is provided, and includes a frame, a light source module, and a microelectromechanical systems (MEMS) module. The frame includes two lateral boards respectively arranged on two opposite sides thereof, and a transverse beam that connects the two lateral boards. Each of the two lateral boards has a guiding slot recessed in a portion thereof. The MEMS module is configured to transmit light emitted from the light source module, and includes a flexible circuit board, a first MEMS unit, and a second MEMS unit, the latter two of which are connected to the flexible circuit board. The first MEMS unit is inserted into the guiding slots of the two lateral boards. The second MEMS unit abuts against the two lateral boards and/or the transverse beam. The first MEMS unit and the second MEMS unit have a predetermined angle there-between by the second frame portion.

20 Claims, 15 Drawing Sheets

Related U.S. Application Data filed on May 29, 2020, provisional application No. 63/031,589, filed on May 29, 2020, provisional application No. 63/031,594, filed on May 29, 2020.

(51) Int. Cl.

| | | |
|---|---|---|
| *G02B 27/01* | (2006.01) | |
| *G02B 26/08* | (2006.01) | |
| *G02B 7/02* | (2021.01) | |
| *B81B 7/00* | (2006.01) | |
| *G03B 21/00* | (2006.01) | |

(52) U.S. Cl.
CPC ..... *G02B 26/0833* (2013.01); *G02B 27/0172* (2013.01); *G02B 27/30* (2013.01); *G03B 21/008* (2013.01); *B81B 2201/042* (2013.01); *G02B 2027/0178* (2013.01)

(58) Field of Classification Search
CPC ............ G03B 21/2013; G03B 21/2033; G03B 21/2053; G02B 27/0101; G02B 27/017; G02B 27/0172; G02B 27/0178; G02B 27/30; G02B 26/0825; G02B 26/0833; G02B 26/10; G02B 26/101; G02B 26/103; G02B 26/105; G02B 26/108; G06K 7/10554; G06K 7/10831; G06K 7/10881; G06K 7/1098; B81B 7/008; B81B 7/0083; B81B 7/0087; B81B 7/0093
See application file for complete search history.

(56) References Cited

U.S. PATENT DOCUMENTS

| | | | |
|---|---|---|---|
| 8,746,563 | B2 | 6/2014 | Hennick et al. |
| 9,366,949 | B2 | 6/2016 | Chiang et al. |
| 9,383,636 | B2 | 7/2016 | Liu |
| 9,846,353 | B2 | 12/2017 | Kilcher et al. |
| 10,203,497 | B2* | 2/2019 | Kamakura ......... G02B 27/0176 |
| 10,237,515 | B2 | 3/2019 | Adler et al. |
| 10,338,378 | B2 | 7/2019 | Brioschi |
| 11,187,913 | B2 | 11/2021 | Chang et al. |
| 2003/0002781 | A1 | 1/2003 | Ford et al. |
| 2006/0077515 | A1 | 4/2006 | Cummings |
| 2006/0078266 | A1 | 4/2006 | Wu et al. |
| 2008/0074728 | A1 | 3/2008 | Ogikubo et al. |
| 2013/0278631 | A1 | 10/2013 | Border et al. |
| 2017/0235128 | A1 | 8/2017 | Brioschi |
| 2020/0226963 | A1* | 7/2020 | Komori .............. G02B 26/0833 |

FOREIGN PATENT DOCUMENTS

| | | |
|---|---|---|
| CN | 108663880 A | 10/2018 |
| CN | 107082406 B | 5/2019 |
| JP | 201354268 A | 3/2013 |
| TW | 200712734 A | 4/2007 |
| TW | I648588 B | 1/2019 |

* cited by examiner

PROJECTING APPARATUS

CROSS-REFERENCE TO RELATED PATENT APPLICATION

This application claims priority to the U.S. Provisional Patent Application Ser. No. 63/031,589 filed on May 29, 2020, the U.S. Provisional Patent Application Ser. No. 63/031,594 filed on May 29, 2020, the U.S. Provisional Patent Application Ser. No. 63/031,593 filed on May 29, 2020, the U.S. Provisional Patent Application Ser. No. 63/031,592 filed on May 29, 2020, which application are incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a projecting apparatus, and more particularly to a projecting apparatus having a microelectromechanical systems (MEMS) module.

BACKGROUND OF THE DISCLOSURE

A conventional projecting apparatus having a microelectromechanical systems (MEMS) module includes two MEMS units having an angle there-between that is required to be precisely maintained at a predetermined value. In the conventional projecting apparatus, the angle is determined by bending a metal plate carrying the two MEMS units. However, the angles defined by bending the metal plate are prone to large deviations.

SUMMARY OF THE DISCLOSURE

In response to the above-referenced technical inadequacy, the present disclosure provides a projecting apparatus to effectively improve on the issues associated with conventional projecting apparatuses.

In one aspect, the present disclosure provides a projecting apparatus, which includes a frame, a light source module, and a microelectromechanical systems (MEMS) module. The frame includes a first frame portion and a second frame portion. The second frame portion includes a partition that is connected to the first frame portion, two lateral boards that are respectively connected to two opposite sides of the partition, and a transverse beam that is arranged away from the partition and that connects the two lateral boards. The frame has a light channel that allows the first frame portion and the partition to be in spatial communication with each other, and each of the two lateral boards has a guiding slot recessed in a portion thereof adjacent to the first frame portion.

The light source module is disposed on the first frame portion. The MEMS module is disposed on the second frame portion and is configured to transmit light that is emitted from the light source module and that travels through the light channel. The MEMS module includes a flexible circuit board, a first MEMS unit, and a second MEMS unit. The first MEMS unit is connected to the flexible circuit board and inserted into the guiding slots of the two lateral boards. The second MEMS unit is connected to the flexible circuit board and abuts against the two lateral boards and/or the transverse beam. The first MEMS unit and the second MEMS unit have a predetermined angle there-between by the second frame portion.

Therefore, the MEMS module of the projecting apparatus in the present disclosure is provided by assembling the first MEMS unit and the second MEMS unit to the frame having a higher forming dimension, thereby precisely controlling the predetermined angle between the first MEMS unit and the second MEMS unit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
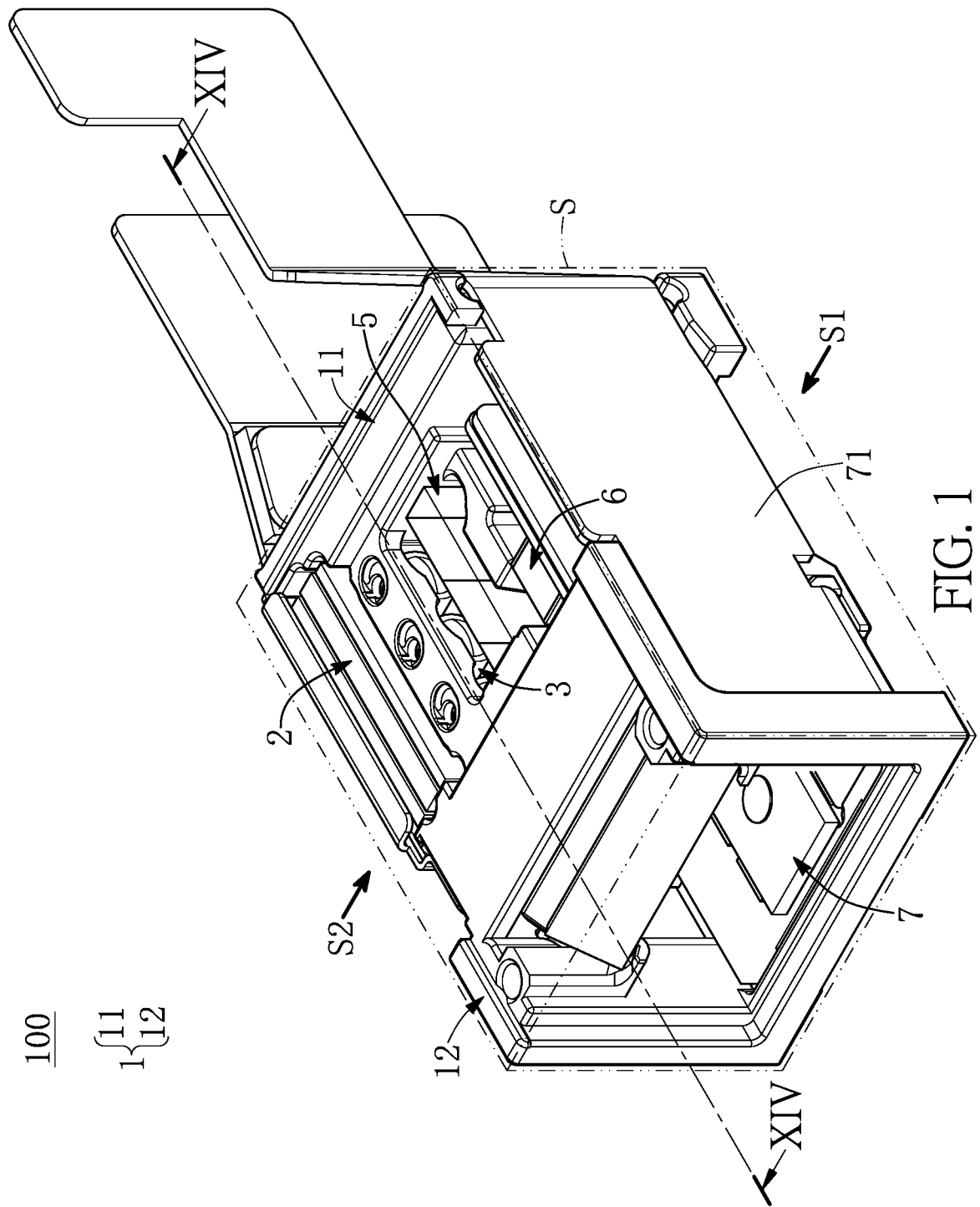
FIG. 1 is a perspective view of a projecting apparatus according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
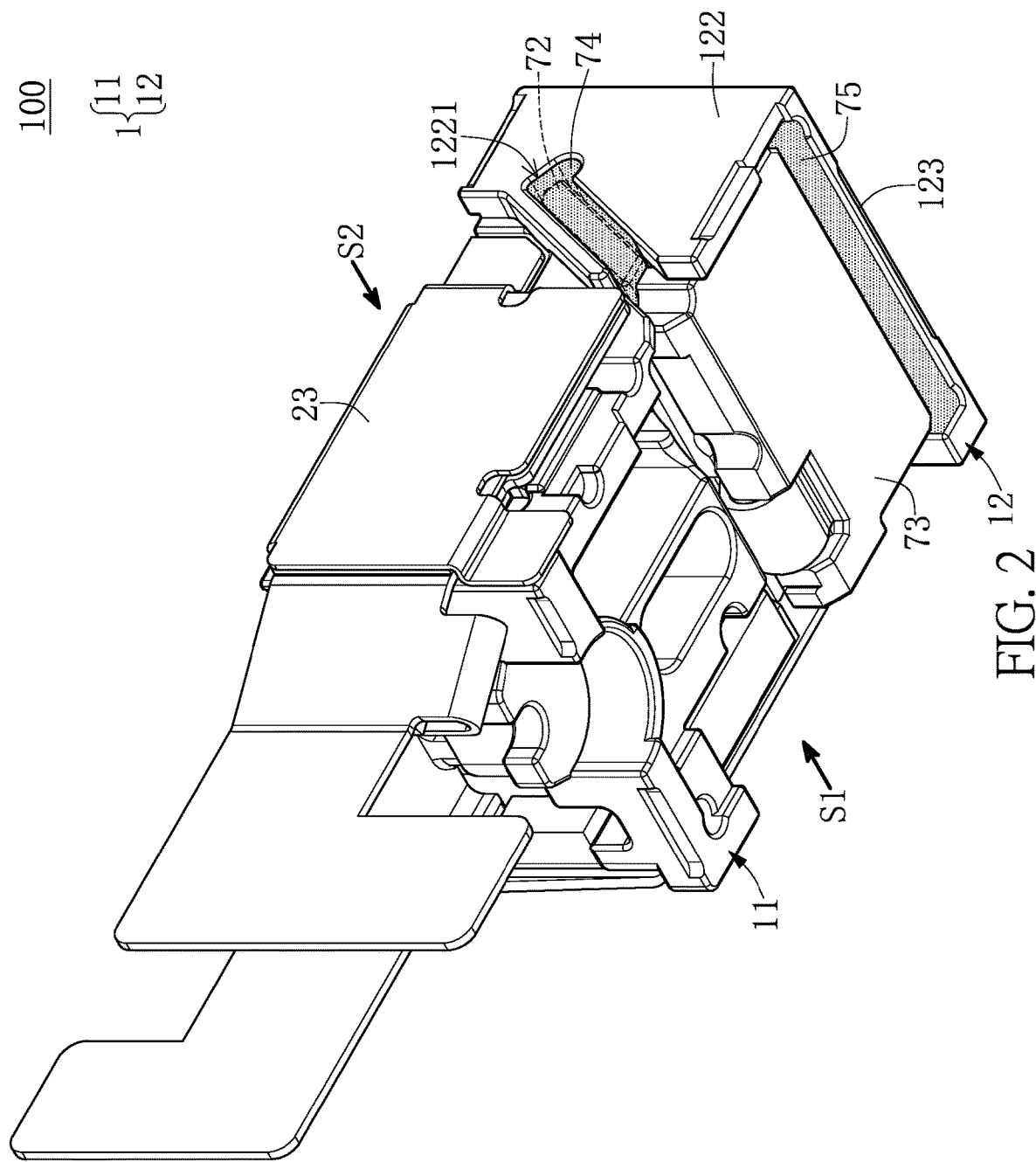
FIG. 2 is a perspective view of FIG. 1 from another angle of view.
Figure 3:
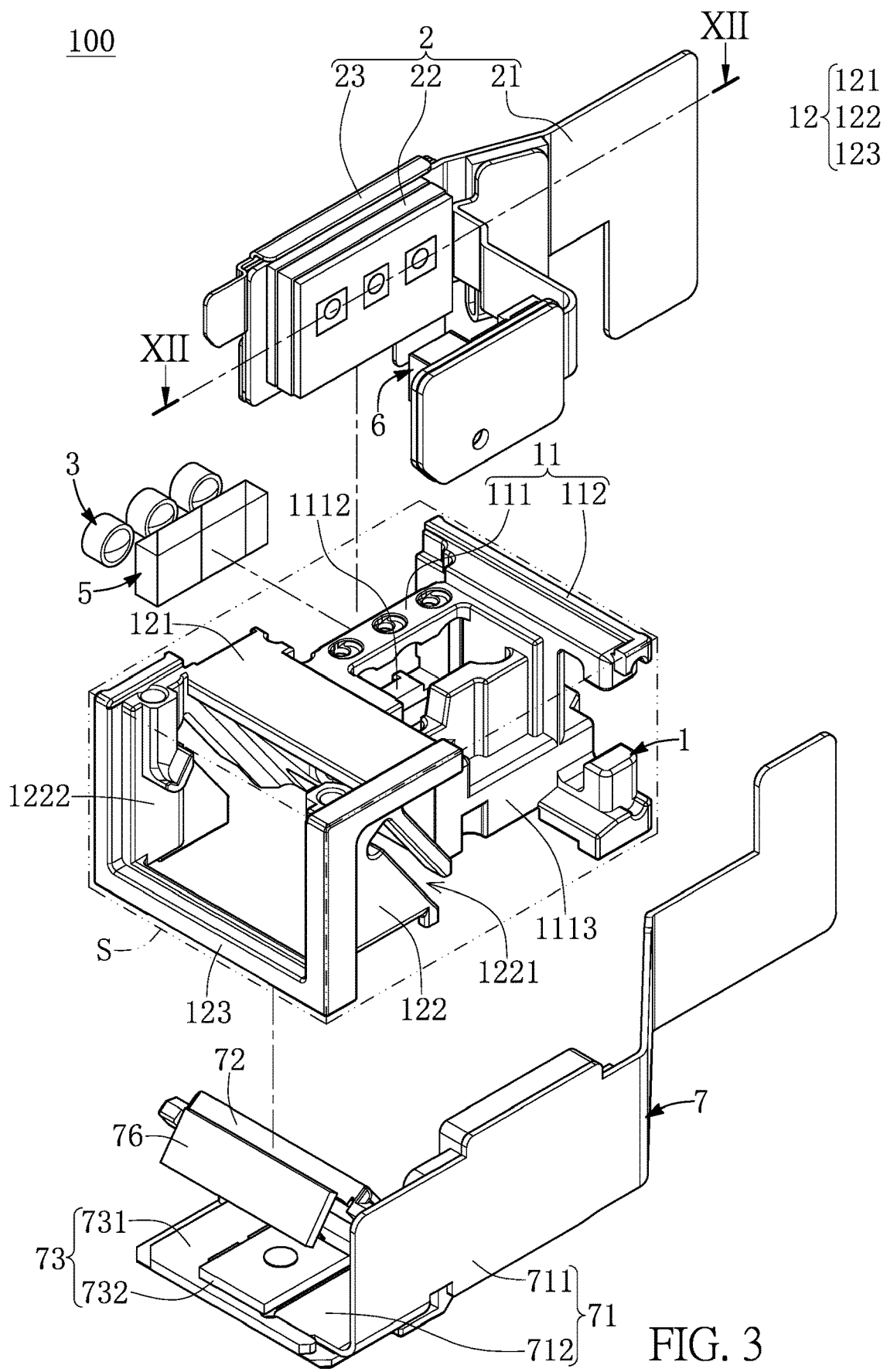
FIG. 3 is an exploded view of FIG. 1 when an adhesive, a first fixing colloid, and a second colloid are omitted.
Figure 4:
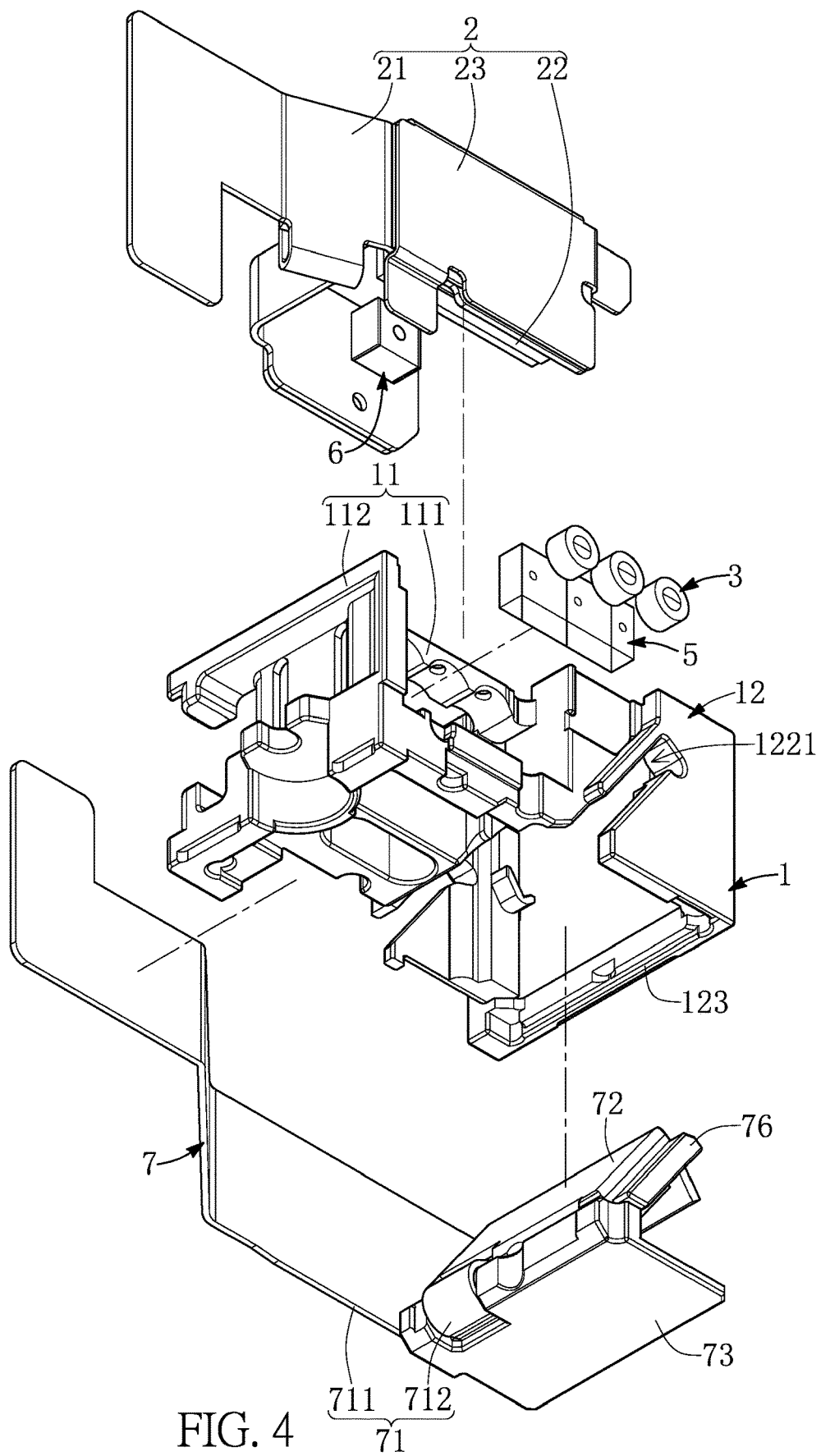
FIG. 4 is an exploded view of FIG. 2 when the adhesive, the first fixing colloid, and the second colloid are omitted.

Referring to FIG. 1 to FIG. 15, an embodiment of the present disclosure provides a projecting apparatus 100. As shown in FIG. 1, FIG. 2, and FIG. 15, the projecting apparatus 100 in the present embodiment is applied to a pair of smart glasses 1000 (e.g., the projecting apparatus 100 is assembled to an eyeglass temple 201 of an eyeglass frame 200), which can be a pair of augmented reality (AR) glasses, but the present disclosure is not limited thereto. As shown in FIG. 2 to FIG. 4, the projecting apparatus 100 includes a frame 1, a light source module 2, a plurality of collimator lenses 3, a plurality of adhesives 4 (as shown in FIG. 7), a light combining lens 5, a photodetector module 6, and a microelectromechanical systems (MEMS) module 7. The following description describes the structural and connection relationship of each component of the projecting apparatus 100 of the present embodiment.

It should be noted that the projecting apparatus 100 in the present embodiment is described having the above components, but the present disclosure is not limited thereto. For example, in other embodiments of the present disclosure not shown in the drawings, the photodetector module 6 can be omitted; or, each of a quantity of the collimator lenses 3 and a quantity of the adhesives 4 can be at least one, and the light combining lens 5 and the photodetector module 6 can be omitted; or, the collimator lenses 3, the adhesives 4, the light combining lens 5, and the photodetector module 6 can be omitted.

Figure 5:
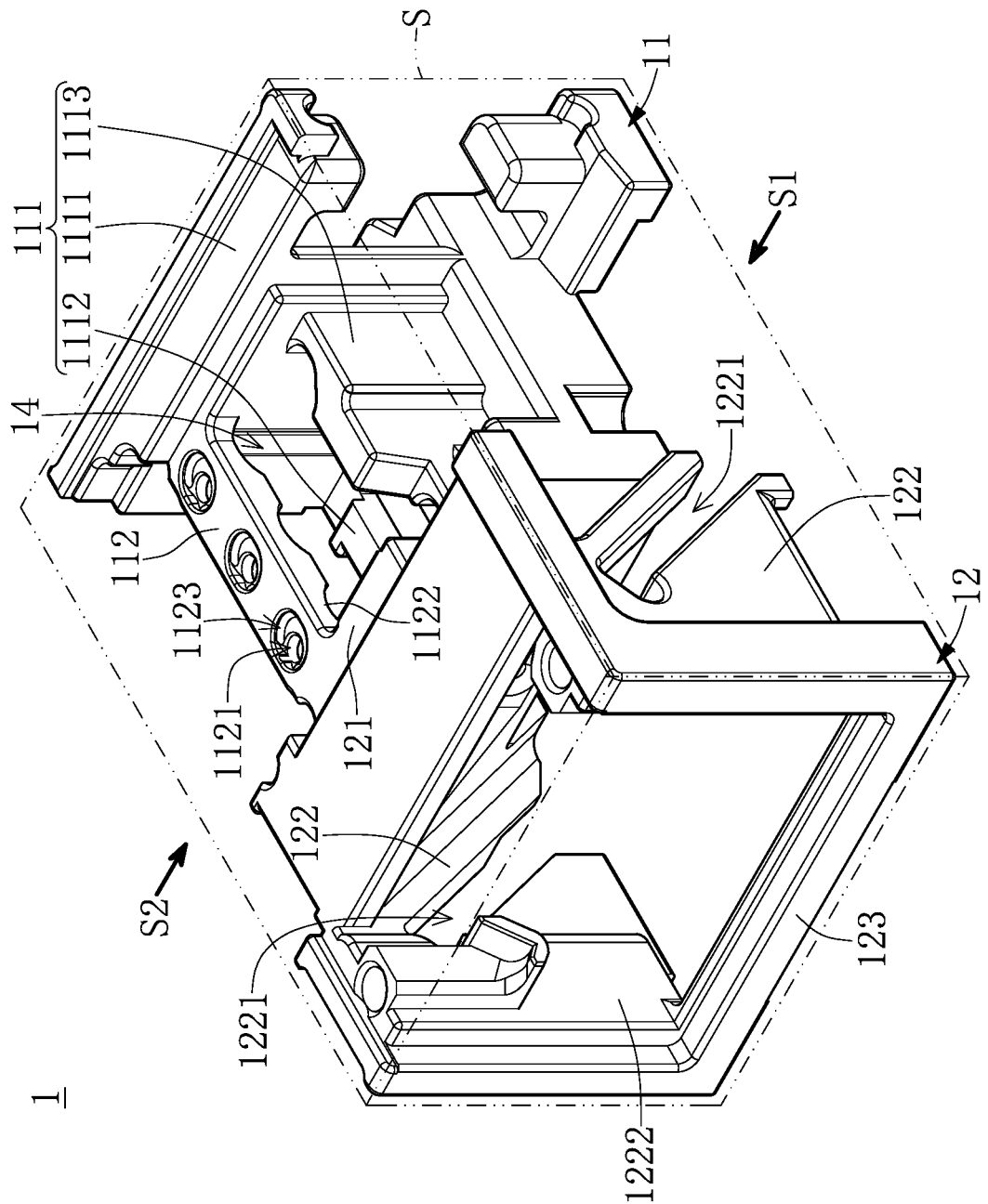
FIG. 5 is a perspective view showing a frame of FIG. 3.
Figure 6:
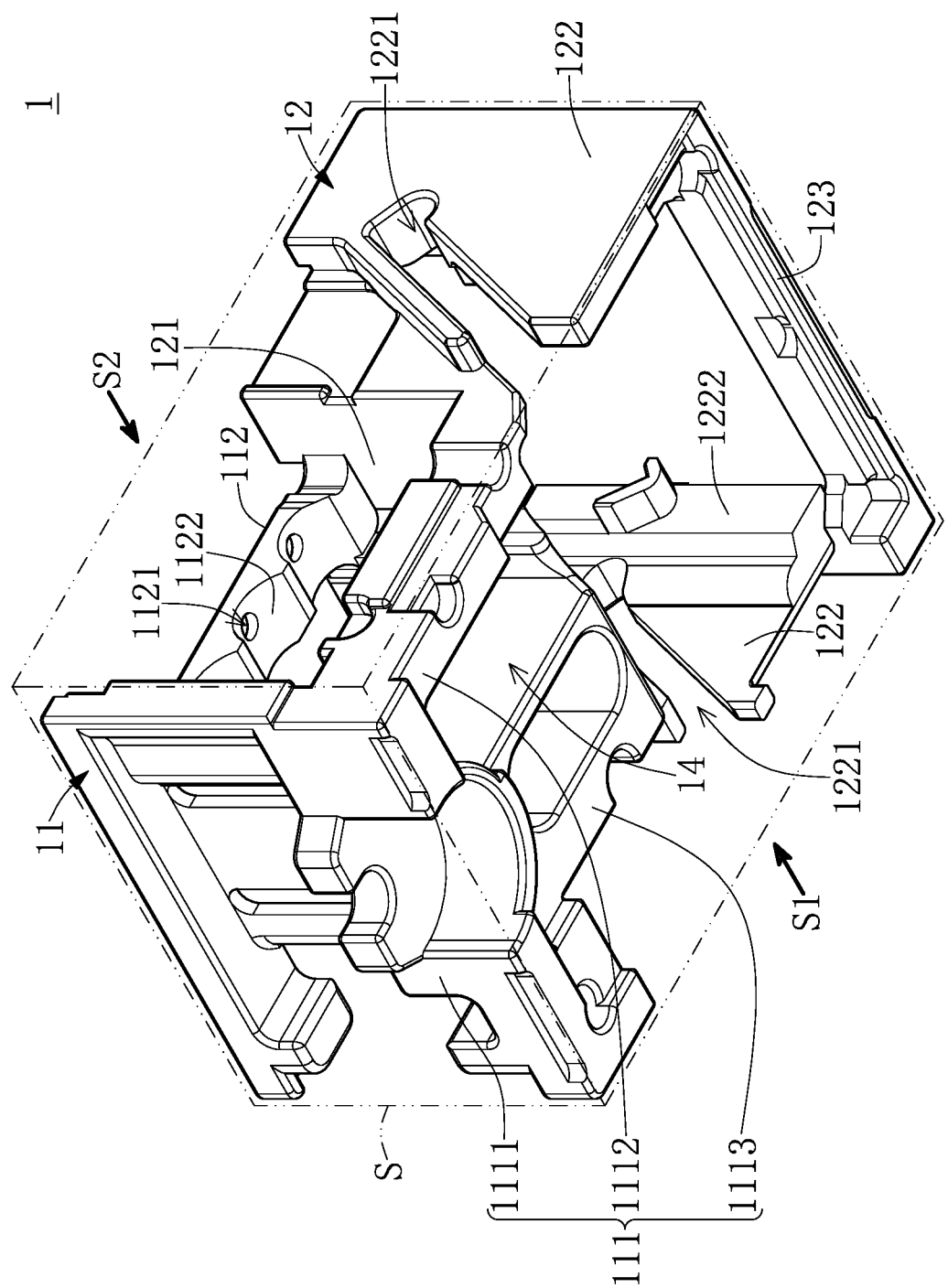
FIG. 6 is a perspective view showing the frame of FIG. 4.
Figure 7:
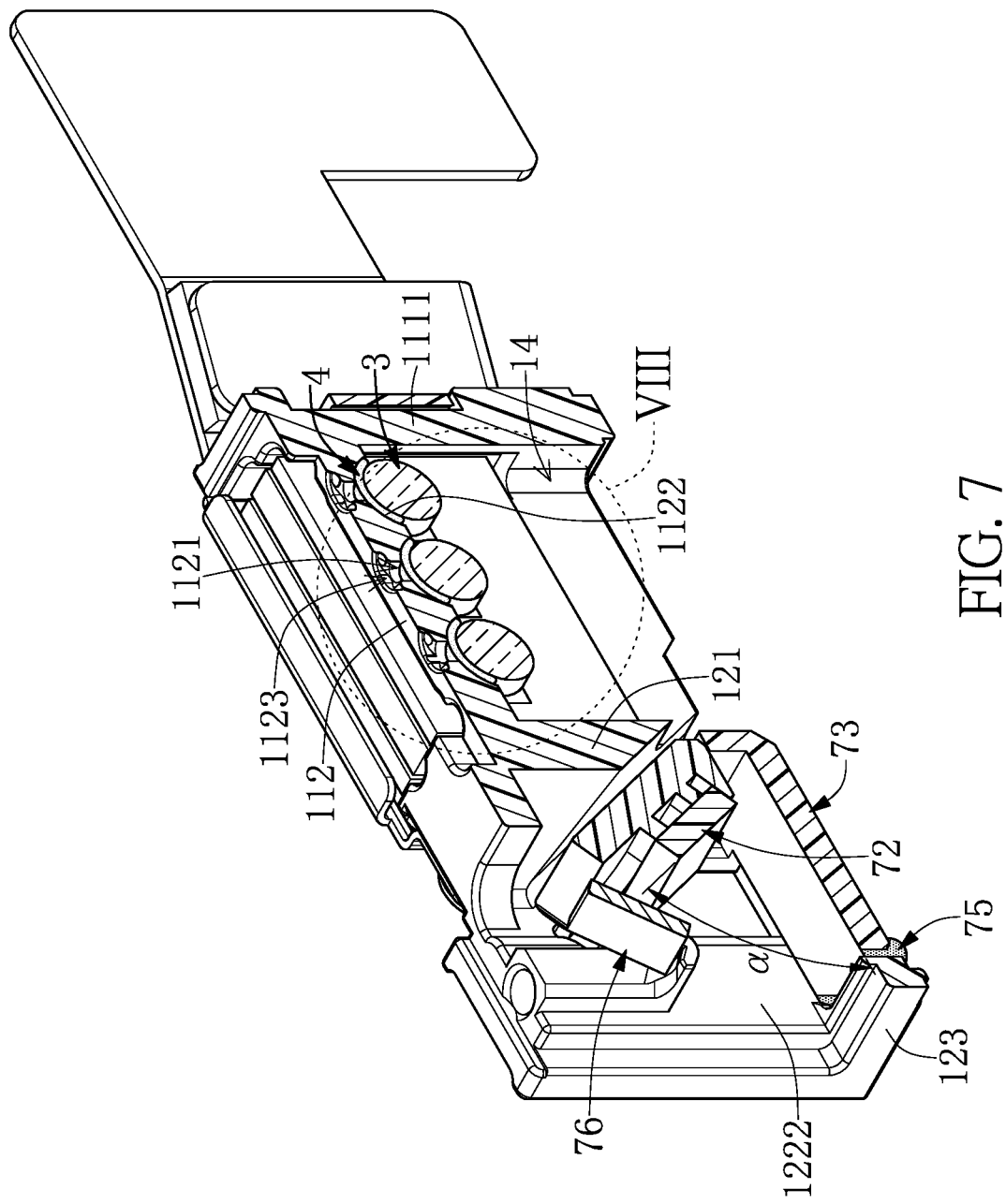
FIG. 7 is a perspective cross-sectional view of FIG. 1 along a cross-sectional plane.

In the present embodiment, as shown in FIG. 5 and FIG. 6, the frame 1 is integrally formed as a single one-piece structure, and corners of the frame 1 jointly define a distribution space S that is preferably in a cuboid shape, but the present disclosure is not limited thereto.

Moreover, as shown in FIG. 3 and FIG. 5, a part of the light source module 2 (e.g., a complex light emitter 22 and a heat sink 23 described in the following description), the light combining lens 5, the collimator lenses 3, the adhesives 4, the photodetector module 6, and a part of the MEMS module 7 (e.g., a first MEMS unit 72 and a second MEMS unit 73 described in the following description) can be located in the distribution space S by at least part of structural designs of the frame 1 of the present embodiment, thereby properly arranging the components of the projecting apparatus 100 to effectively control a shape and a volume of the projecting apparatus 100, but the present disclosure is not limited thereto.

Figure 9:
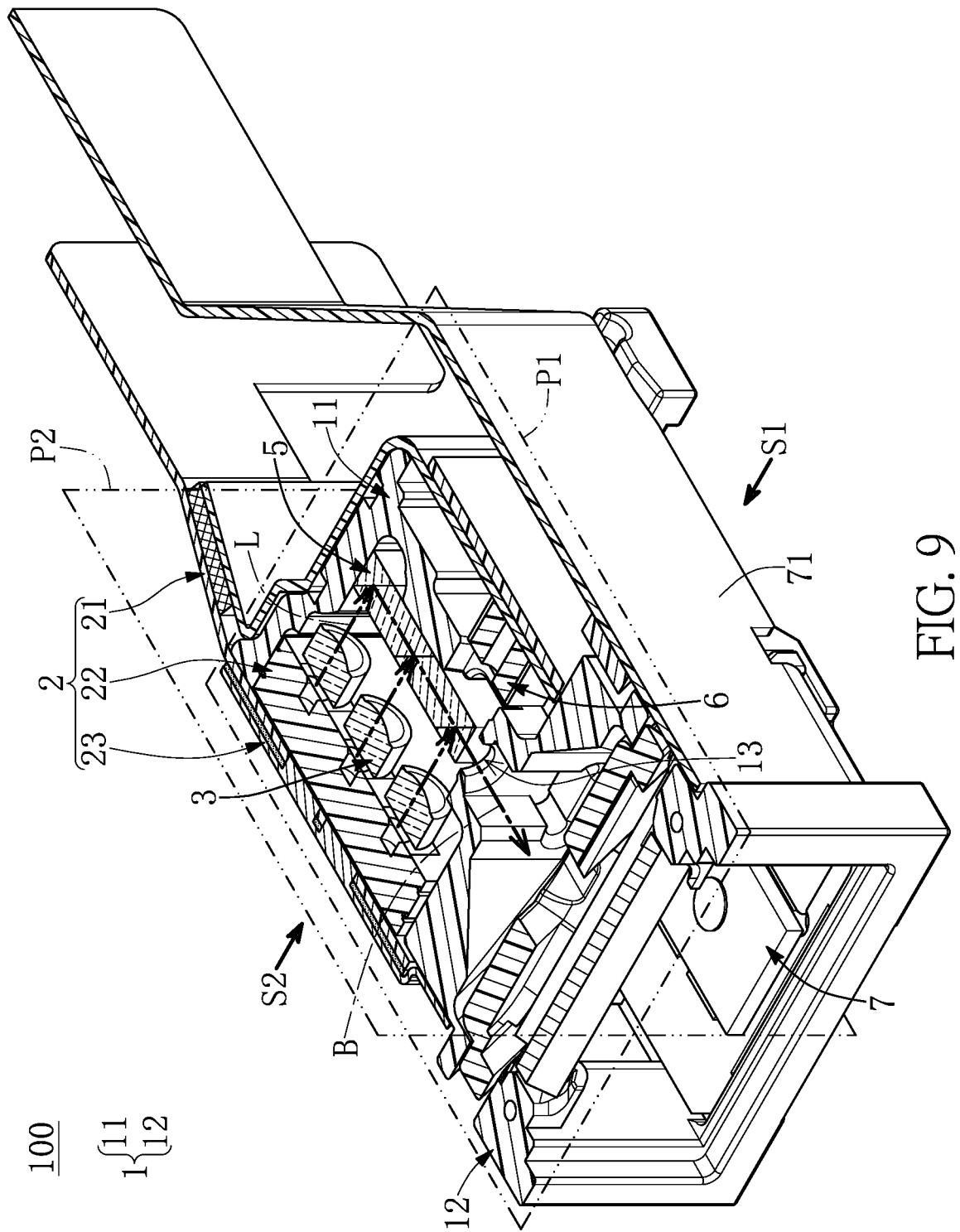
FIG. 9 is a perspective cross-sectional view of FIG. 1 along a light combining plane.

As shown in FIG. 5 and FIG. 6, the frame 1 includes a first frame portion 11 and a second frame portion 12 that is connected to the first frame portion 11. The frame 1 has a light channel 13 (as shown in FIG. 9) that allows the first frame portion 11 and the second frame portion 12 to be in spatial communication with each other. In the present embodiment, a same side for both the first frame portion 11 and the second frame portion 12 (e.g., a rear left side of the frame 1 shown in FIG. 5) is defined as a user side S1, and another side for both the first frame portion 11 and the second frame portion 12 (e.g., a front right side of the frame 1 shown in FIG. 5) is defined as a heat dissipating side S2.

It should be noted that when the projecting apparatus 100 is applied to the smart glasses 1000 (as shown in FIG. 15) worn by a user, a side of the projecting apparatus 100 adjacent to the user is the user side S1, and the heat dissipating side S2 of the projecting apparatus 100 is opposite to the user side S1, but the present disclosure is not limited thereto.

As shown in FIG. 5 and FIG. 6, the first frame portion 11 includes a carrier 111 and a carrying bridge 112. An end of the carrying bridge 112 is connected to the carrier 111, and another end of the carrying bridge 112 is connected to the second frame portion 12. The carrier 111 includes an end board 1111 that is arranged away from the second frame portion 12, a first seat 1112, and a second seat 1113. Each of the first seat 1112 and the second seat 1113 is connected to the end board 1111 and the second frame portion 12. The second frame portion 12 and the end board 1111 are respectively connected to the two ends of the carrying bridge 112, and the first seat 1112 and the second seat 1113 are located between the second frame portion 12 and the end board 1111.

Figure 8:
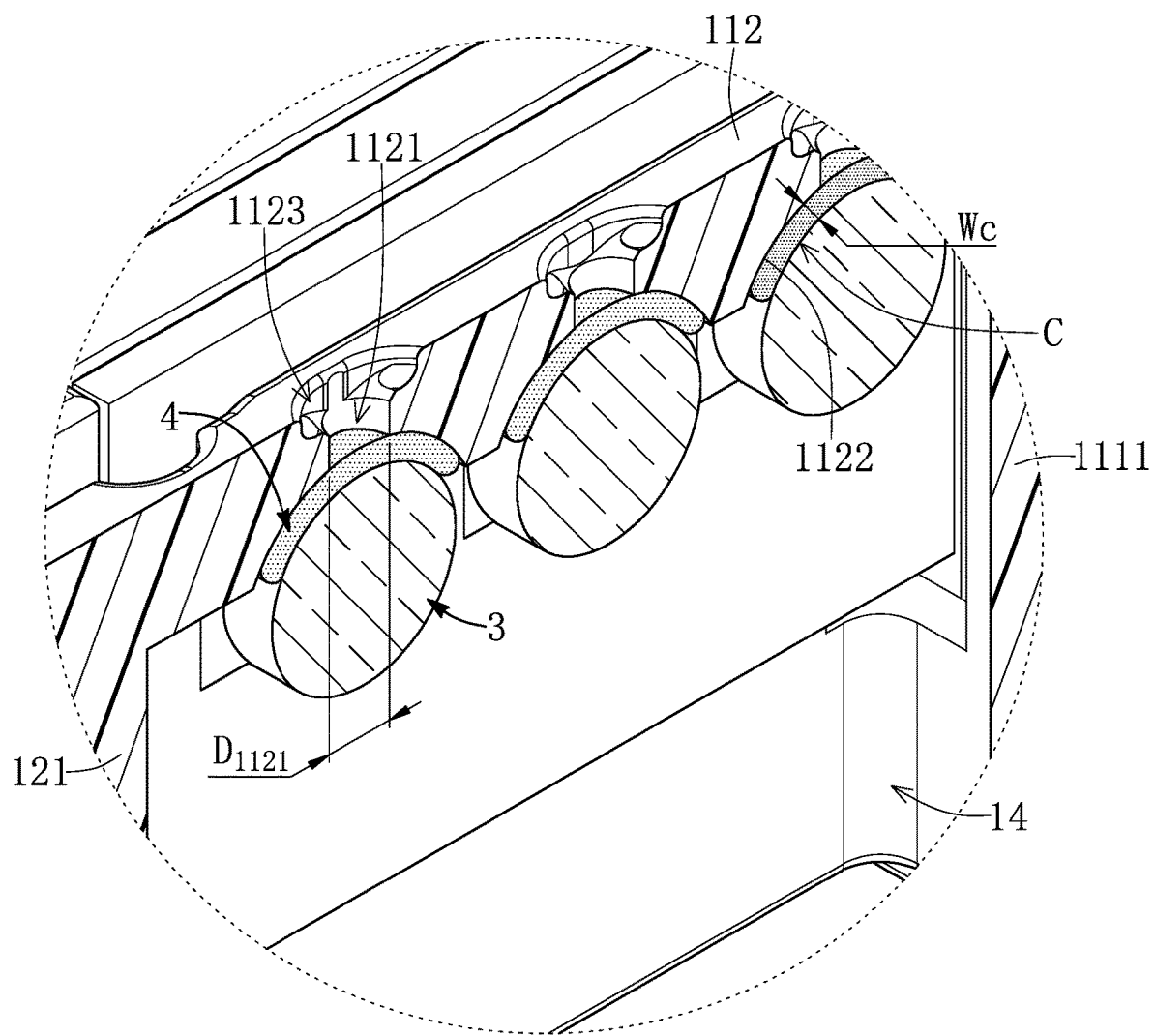
FIG. 8 shows an enlarged view of part VIII of FIG. 7.

Moreover, the frame 1 has a processing slot 14 using the carrying bridge 112 as a bottom thereof, and the first seat 1112 and the second seat 1113 are respectively located at two opposite sides of the processing slot 14. In other words, as shown in FIG. 7 and FIG. 8, a bottom side of the frame 1 is configured to allow any one of the collimator lenses 3 to be inserted into the processing slot 14 along a straight direction for being arranged adjacent to the carrying bridge 112.

Specifically, as shown in FIG. 5 to FIG. 8, the carrying bridge 112 has a plurality of thru-holes 1121 that are in spatial communication with the processing slot 14. Any one of the thru-holes 1121 has an aperture $D_{1121}$. The carrying bridge 112 has a plurality of channel walls 1122 that are arranged on the bottom of the processing slot 14 and that are respectively connected to walls of the thru-holes 1121.

Moreover, the carrying bridge 112 has a plurality of receiving slots 1123 that are recessed in a surface thereof (e.g., a top surface of the carrying bridge 112 shown in FIG. 8) away from the processing slot 14 and that are spaced apart from each other, and each of the thru-holes 1121 is recessed in a bottom of one of the receiving slots 1123. In the present embodiment, a center of the bottom of any one of the receiving slots 1123 does not overlap with a center of the corresponding thru-hole 1121, but the present disclosure is not limited thereto.

The second frame portion 12 includes a partition 121 that is connected to the first frame portion 11, two lateral boards 122 that are respectively connected to two opposite sides of the partition 121, and a transverse beam 123 that is arranged away from the partition 121 and that connects to the two lateral boards 122. The partition 121 in the present embodiment is connected to a corresponding one of the two ends of the carrying bridge 112 and has the light channel 13. The two lateral boards 122 are respectively located at the user side S1 and the heat dissipating side S2, and each of the two lateral boards 122 has a guiding slot 1221 recessed in a portion thereof adjacent to the first frame portion 11.

Specifically, the two guiding slots 1221 correspond in position to each other, and obliquely extend along a direction gradually away from the partition 121 or the first frame portion 11. Two ends of the transverse beam 123 are respectively connected to bottom corners of the two lateral boards 122 away from the first frame portion 11. In addition, inner sides of the two lateral boards 122 respectively have two retaining structures 1222 that face each other and are arranged adjacent to the transverse beam 123.

Figure 10:
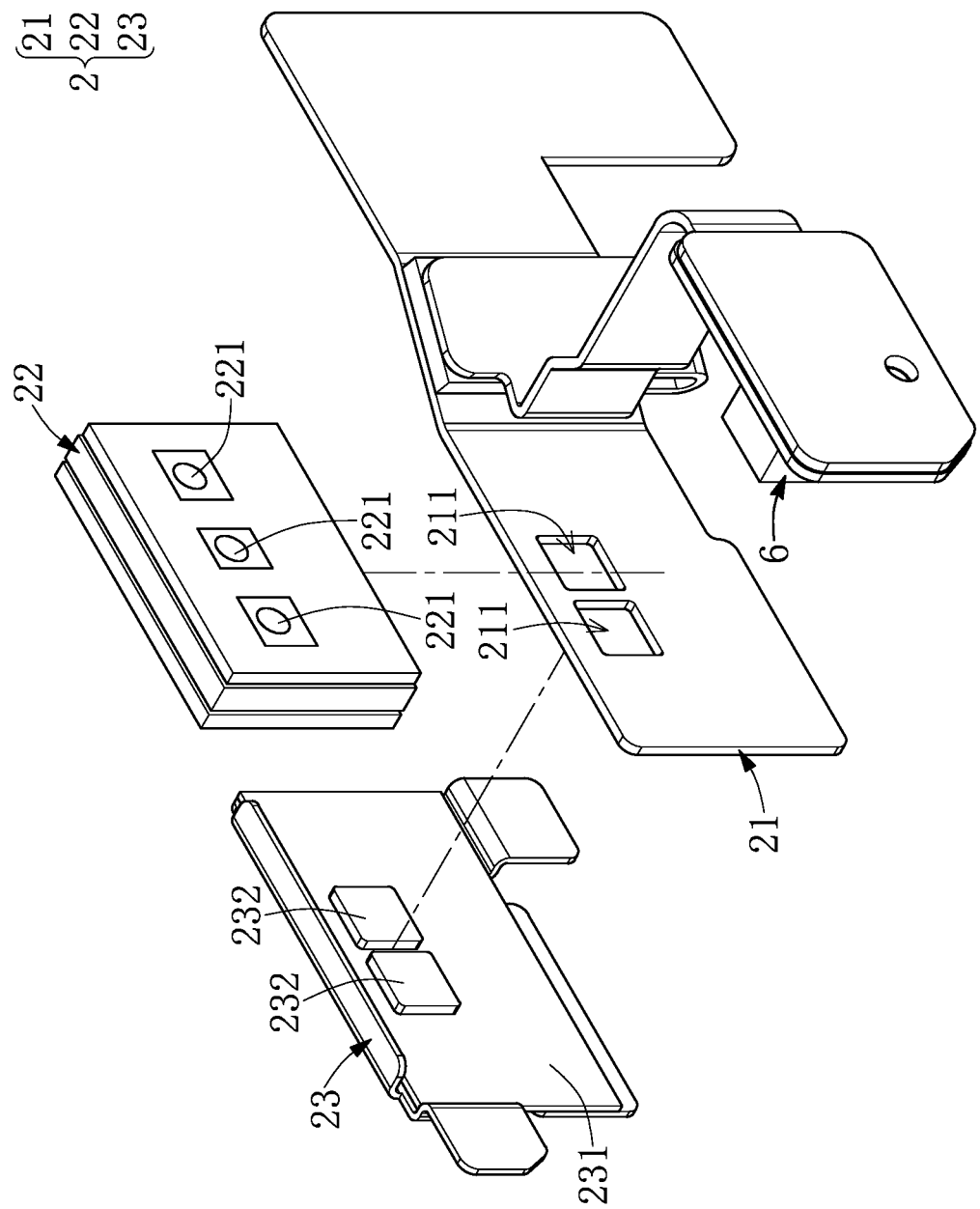
FIG. 10 is an exploded view showing a light source module and a photodetector module of FIG. 3.

As shown in FIG. 3, FIG. 9, and FIG. 10, the light source module 2 is disposed on the carrier 111 (e.g., the first seat 1112) and defines a plurality of optical axes L. The light source module 2 includes a light controlling flexible board 21, a complex light emitter 22 that is disposed on the light controlling flexible board 21, and a heat sink 23 that is connected to the complex light emitter 22. Moreover, the complex light emitter 22 is disposed on the first frame portion 11 and defines the optical axes L, and the heat sink 23 is located at the heat dissipating side S2 of the frame 1, thereby facilitating to rapidly dissipate heat energy generated from the complex light emitter 22.

Figure 11:
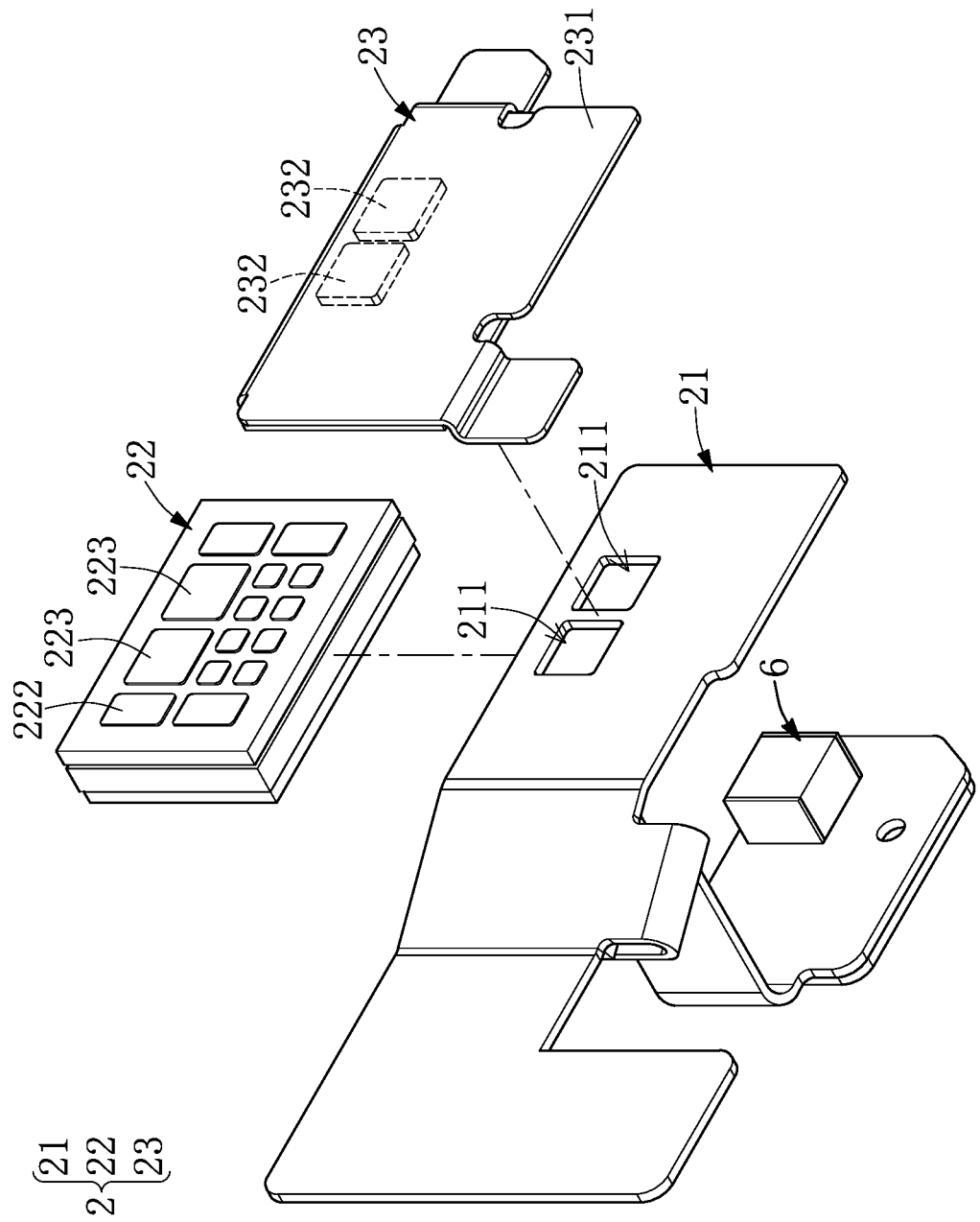
FIG. 11 is an exploded view showing the light source module and the photodetector module of FIG. 4.
Figure 12:
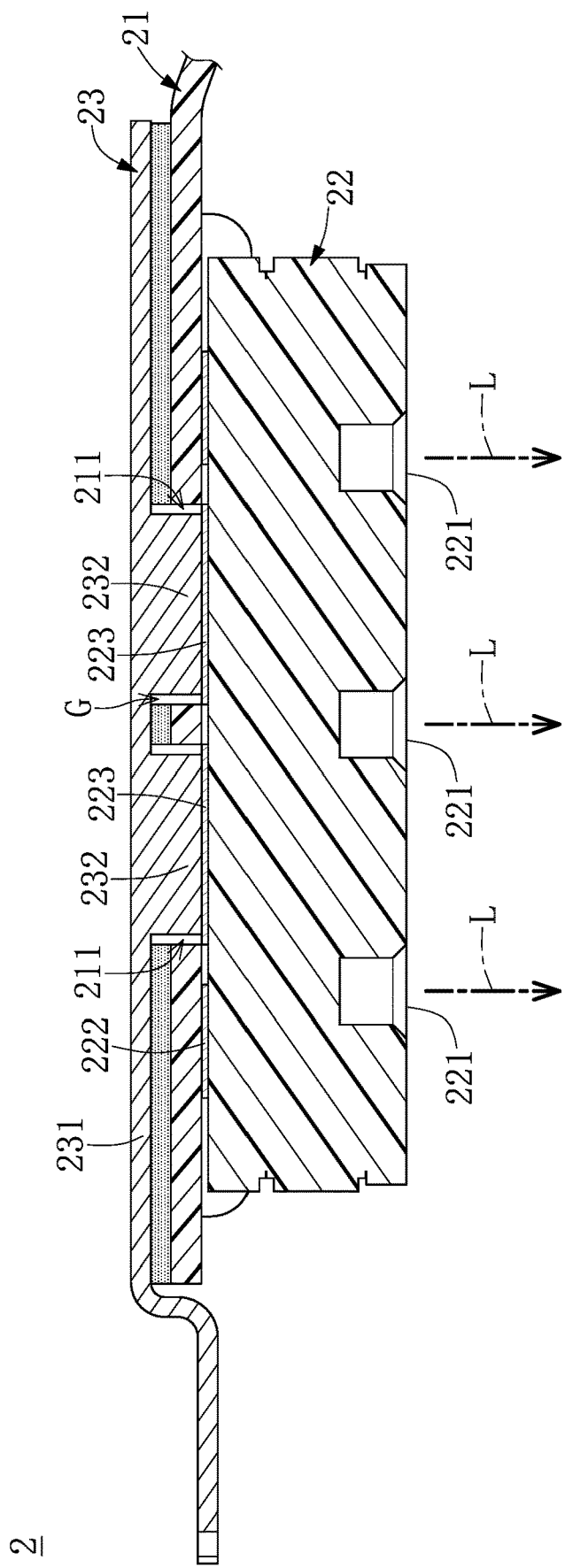
FIG. 12 is a cross-sectional view taken along line XII-XII of FIG. 3.

Specifically, as shown in FIG. 10 to FIG. 12, the complex light emitter 22 includes a plurality of light emitting units 221 that respectively define the optical axes L, a plurality of signal pads 222 that are electrically coupled to the light emitting units 221, and at least one heat dissipating pad 223. The signal pads 222 of the complex light emitter 22 are assembled to the light controlling flexible board 21, so that the light controlling flexible board 21 is electrically coupled to the light emitting units 221 through the signal pads 222.

Moreover, the light controlling flexible board 21 has at least one accommodating hole 211. The heat sink 23 includes a flat portion 231 and at least one heat conductive portion 232 that protrudes from the flat portion 231. The flat portion 231 is fixed to (e.g., adhered to) the light controlling flexible board 21, and the at least one heat conductive portion 232 is connected to the at least one heat dissipating pad 223 by passing through the at least one accommodating hole 21, so that the heat energy generated from the complex light emitter 22 can be rapidly transmitted to the heat sink 23 directly through the at least one heat dissipating pad 223.

In the present embodiment, the at least one heat conductive portion 232 and a wall of the at least one accommodating hole 211 preferably have a gap G there-between, so that the heat energy received by the at least one heat conductive portion 232 can be rapidly transmitted to the flat portion 231. In other words, any heat dissipating component provided without any gap surrounding a heat conductive portion thereof is different from the heat sink 23 of the present embodiment.

It should be noted that the complex light emitter 22 in the present embodiment is a three-in-one emitter with a single chip type for reducing volume of the projecting apparatus 100, but the present disclosure is not limited thereto. For example, in other embodiments of the present disclosure not shown in the drawings, the light source module 2 can include a light controlling flexible board 221 and a plurality of light emitting units 221 that are assembled to the light controlling flexible board 221 and that respectively define the optical axes L, in which the light emitting units 221 are not integrated in one chip and are separate from each other.

As shown in FIG. 8 and FIG. 9, the collimator lenses 3 are located in the processing slot 14 of the frame 1 and correspond in position to the light source module 2 (e.g., the collimator lenses 3 are spaced apart from each other and are respectively located on the optical axes L). The collimator lenses 3 are arranged in the processing slot 14 by passing through the bottom side of the frame 1, so that the collimator lenses 3 can be arranged adjacent to the carrying bridge 112 and can respectively correspond in position to the thru-holes 1121.

Specifically, the collimator lenses 3 respectively face toward the channel walls 1122 of the carrying bridge 112, and each of the channel walls 1122 and the corresponding collimator lens 3 jointly define a capillary channel C being in spatial communication with the corresponding thru-hole 1121 (e.g., the capillary channel C is in a substantial semi-circular arc shape). In the present embodiment, each of the channel walls 1122 corresponds in shape to the corresponding collimator lens 3, so that the capillary channels C have a same width Wc, but the present disclosure is not limited thereto.

As shown in FIG. 7 and FIG. 8, the adhesives 4 are spaced apart from each other and respectively correspond in position to the thru-holes 1121, and each of the adhesives 4 is filled within one of the capillary channels C, so that each of the collimator lenses 3 can be adhered and fixed to the carrying bridge 112 through one of the adhesives 4. Specifically, the adhesives 4 are respectively arranged in the receiving slots 1123, and then each of the adhesives 4 gradually flows into the corresponding thru-hole 1121 by gravity and further fills into the corresponding capillary channel C by the capillary phenomenon.

Accordingly, the adhesives 4 can be controlled to have a substantial same volume and can have a same shrinkage direction (e.g., a direction toward the carrying bridge 112) when being solidified, such that an offset of each of the adhesives 4 caused by the shrinkage can be controlled for facilitating to increase an assembling precision of the corresponding collimator lens 3.

As shown in FIG. 3 and FIG. 9, the light combining lens 5 is disposed on the first frame portion 11 (e.g., the second seat 1113 of the carrier 111) and located on the optical axes L of the light source module 2. The collimator lenses 3 are located between the light source module 2 and the light combining lens 5. The light combining lens 5 defines a light combining path B passing through the light channel 13.

It should be noted that the light combining lens 5 in the present embodiment is a single one-piece structure, but the specific structure of the light combining lens 5 can be adjusted or changed according to design requirements. For example, in other embodiments of the present disclosure not shown in the drawings, the light combining lens 5 can include a plurality of lenses spaced apart from each other. Furthermore, in one embodiment of the present disclosure not shown in the drawings, the light combining lens 5 can be omitted, and each of a quantity of the thru-holes 1121, a quantity of the collimator lens 3, and a quantity of the adhesives 4 can be at least one. Specifically, the at least one adhesive 4 corresponds in position to the at least one thru-hole 1121, and the at least one collimator lens 3 is located in the processing slot 14 and is adhered and fixed to the carrying bridge 112 through the at least one adhesive 4. Accordingly, the volume and the shrinkage direction of the at least one adhesive 4 are predictable, such that an offset of the at least one adhesive 4 caused by the shrinkage can be controlled for facilitating to increase an assembling precision of the at least one collimator lens 3.

The photodetector module 6 is disposed on the carrier 111 (e.g., the second seat 1113), and the light combining lens 5 is located between the photodetector module 6 and the collimator lenses 3. The photodetector module 6 is configured to receive light that is emitted from the light source module 2 and that travels through the light combining lens 5 and at least one of the collimator lenses 3. Specifically, the light controlling flexible board 21 is electrically coupled to the photodetector module 6, and the light controlling flexible board 21 is configured to adjust a lighting intensity of at least one of the light emitting units 221 according to the light received by the photodetector module 6, but the present disclosure is not limited thereto.

Figure 14:
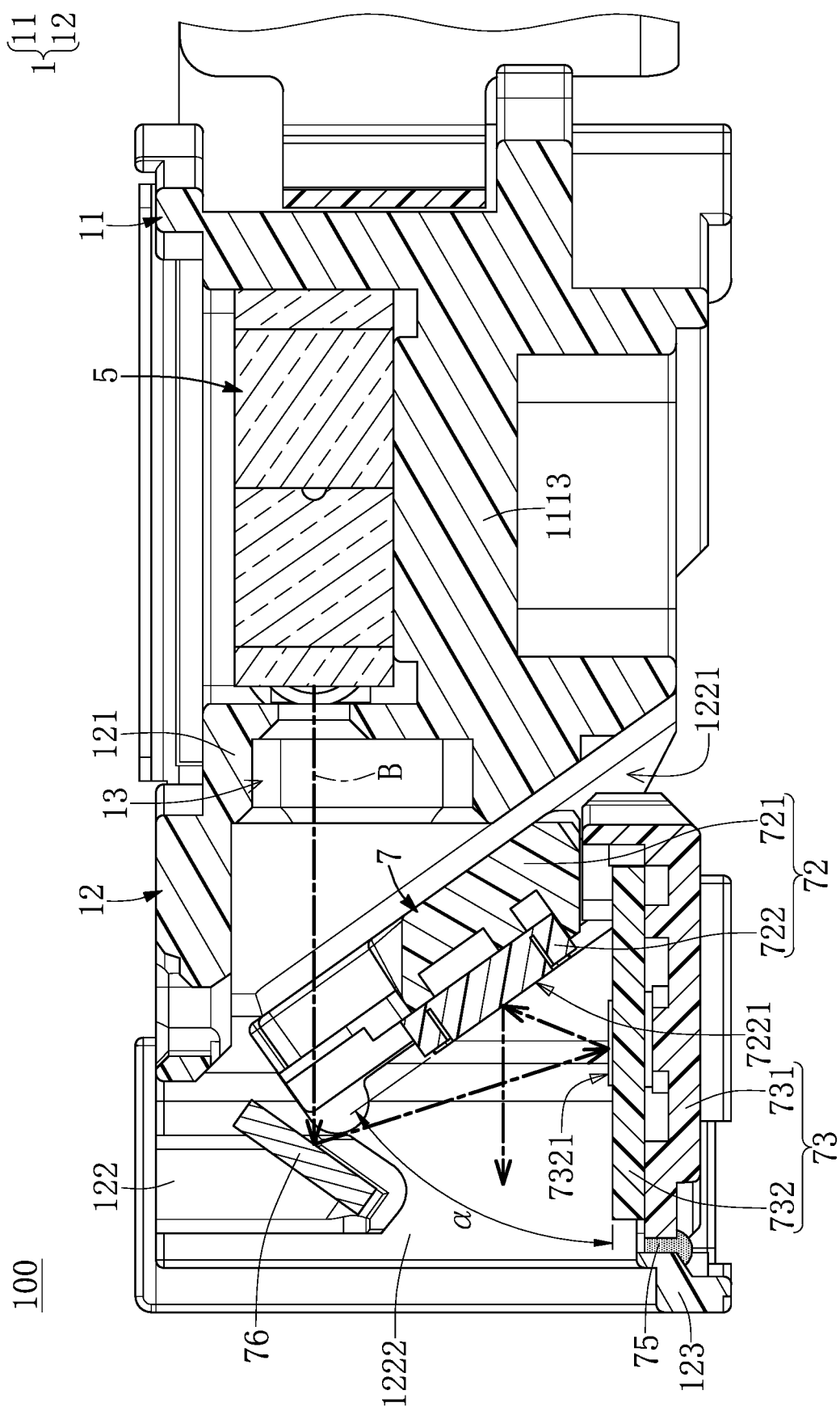
FIG. 14 is a cross-sectional view taken along line XIV-XIV of FIG. 1.
Figure 15:
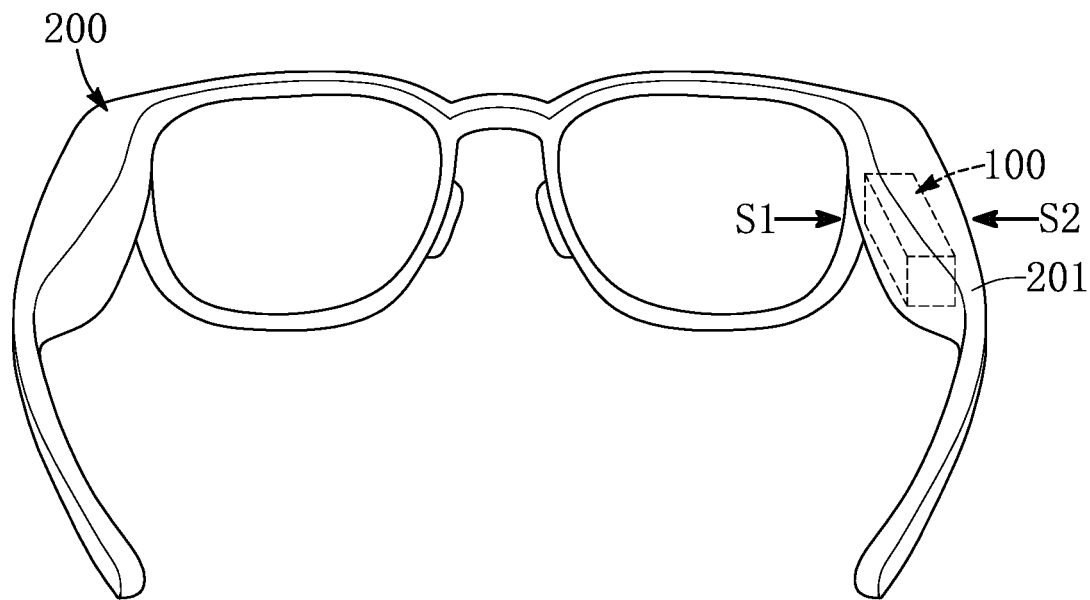
FIG. 15 is a perspective view showing the projecting apparatus applied to a pair of smart glasses according to the embodiment of the present disclosure.

In addition, the optical axes L and the light combining path B jointly define a light combining plane P1 (e.g., a cross-sectional plane shown in FIG. 9), and the MEMS module 7 is configured to reflect light, which travels along the light combining path B, at a light transmitting plane P2 (e.g., a cross-sectional plane shown in FIG. 14). In the present embodiment, the light combining plane P1 and the light transmitting plane P2 have an angle there-between that is within a range from 85 degrees to 95 degrees (e.g., the angle can be 90 degrees), so that the components of the projecting apparatus 100 can be properly arranged in the distribution space S of the frame 1 to effectively control the shape and volume of the projecting apparatus 100.

As shown in FIG. 9, the MEMS module 7 is disposed on the second frame portion 12 and is configured to transmit light that is emitted from the light source module 2 and that travels through the light channel 13 (or the light combining path B). As shown in FIG. 2, FIG. 3, FIG. 13, and FIG. 14, the MEMS module 7 includes a flexible circuit board 71, a first MEMS unit 72 and a second MEMS unit 73 that are both connected to the flexible circuit board 71, two first fixing colloids 74 that fix the first MEMS unit 72 onto the second frame portion 12, a second fixing colloid 75 that fixes the second MEMS unit 73 onto the second frame portion 12, and a reflector 76 that corresponds in position to the second MEMS unit 73. In addition, components of the MEMS module 7 can be further added or reduced according to design requirements and are not limited by the present embodiment.

In the present embodiment, the flexible circuit board 71 includes a main portion 711 and an extension portion 712 that is connected to the main portion 711. The main portion 711 covers an outer side of one of the two lateral boards 122 (e.g., the lateral board 122 located at the user side S1), and the extension portion 712 curvedly extends from the main portion 711 and is connected to the first MEMS unit 72 and the second MEMS unit 73.

Moreover, the first MEMS unit 72 is inserted into the guiding slots 1221 of the two lateral boards 122, the second MEMS unit 73 abuts against the two lateral boards 122 (e.g., the retaining structures 1222) and/or the transverse beam 123, so that the first MEMS unit 72 and the second MEMS unit 73 can have a predetermined angle α there-between by the second frame portion 12.

Accordingly, the MEMS module 7 in the present embodiment is provided by assembling the first MEMS unit 72 and the second MEMS unit 73 to the frame 1 having a higher forming dimension (e.g., the frame 1 can be formed in a molding manner), thereby precisely controlling the predetermined angle α between the first MEMS unit 72 and the second MEMS unit 73.

Figure 13:
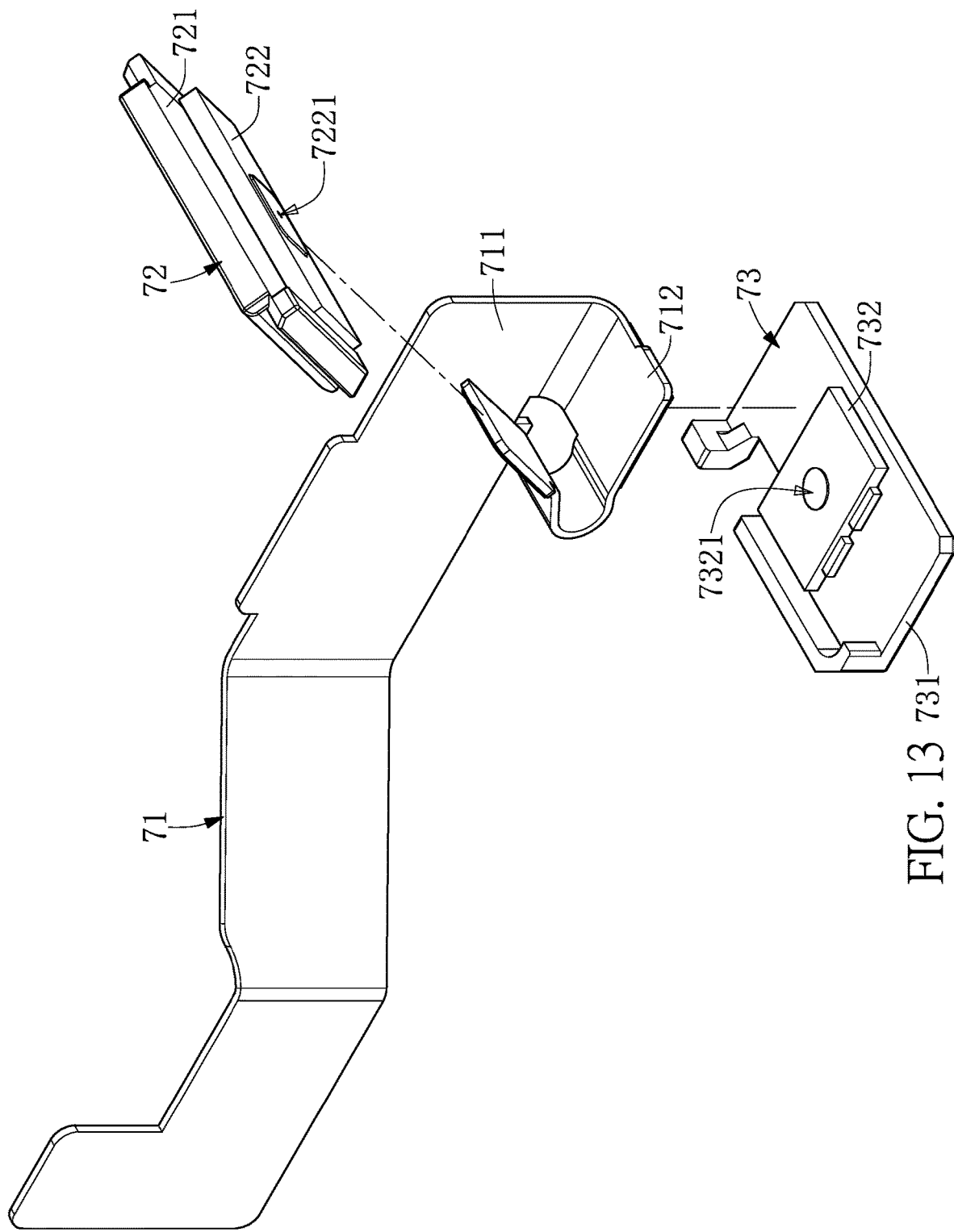
FIG. 13 is an exploded view showing a microelectromechanical systems (MEMS) module of the projecting apparatus according to the embodiment of the present disclosure when the first fixing colloid and the second fixing colloid are omitted.

Specifically, as shown in FIG. 2 and FIG. 13, the first MEMS unit 72 includes a first carrying board 721 and a first MEMS member 722 that is assembled to the first carrying board 721. Two lateral portions of the first carrying board 721 are respectively inserted into the guiding slots 1221 of the two lateral boards 122, and the two first fixing colloids 74 are respectively located in the guiding slots 1221 of the two lateral boards 122. In the MEMS module 7 of the present embodiment, each of the guiding slots 1221 of the two lateral boards 122 is connected to a corresponding portion of the first MEMS unit 72 (e.g., one of the two lateral portions of the first MEMS member 721) fixed therein through one of the two first fixing colloids 74. Moreover, the first MEMS member 722 is connected to the flexible circuit board 71 (e.g., a portion of the flexible circuit board 71 abuts against the first carrying board 721 and is electrically coupled to the first MEMS member 722).

The second MEMS unit 73 includes a second carrying board 731 and a second MEMS member 732 that is assembled to the second carrying board 731. The first carrying board 721 and the second carrying board 731 are spaced apart from each other, the second carrying board 731 abuts against the two lateral boards 122 (e.g., the retaining structures 1222) and/or the transverse beam 123, and the MEMS module 7 in the present embodiment uses the second fixing colloid 75 to fix (or adhere) the second MEMS unit 73 (e.g., the second carrying board 731) onto the transverse beam 123, but the present disclosure is not limited thereto. Moreover, the second MEMS member 732 is connected to the flexible circuit board 71 (e.g., another portion of the flexible circuit board 71 abuts against the second carrying board 731 and is electrically coupled to the second MEMS member 732).

Accordingly, as shown in FIG. 14, a micro-mirror 7221 of the first MEMS member 722 and a micro-mirror 7321 of the second MEMS member 732 in the present embodiment can have the predetermined angle α there-between by using the first carrying board 721 and the second carrying board 731 to be in cooperation with the second frame portion 12.

It should be noted that the MEMS module 7 in the present embodiment is provided with the two first fixing colloids 74 and the second fixing colloid 75 to fix the first MEMS unit 72 and the second MEMS unit 73 onto the second frame portion 12, thereby further increasing precision of the predetermined angle α, but the present disclosure is not limited thereto. For example, in other embodiments of the present disclosure not shown in the drawings, the first MEMS unit 72 and the second MEMS unit 73 can be fixed onto the second frame portion 12 in other manners (e.g., an engaging manner or a screwing manner).

Beneficial Effects of the Embodiment

In conclusion, the at least one collimator lens of the projecting apparatus in the present disclosure is adhered and fixed to the carrying bridge through the at least one adhesive, and based on the volume and the shrinkage direction of the at least one adhesive being predictable, an offset of the at least one adhesive caused by the shrinkage can be controlled for facilitating to increase an assembling precision of the at least one collimator lens.

Moreover, the MEMS module of the projecting apparatus in the present disclosure is provided by assembling the first MEMS unit and the second MEMS unit to the frame having a higher forming dimension, thereby precisely controlling the predetermined angle between the first MEMS unit and the second MEMS unit.

Furthermore, in the projecting apparatus of the present disclosure, at least one heat conductive portion is connected to the at least one heat dissipating pad by passing through the at least one accommodating hole, so that the heat energy generated from the complex light emitter can be rapidly transmitted to the heat sink directly through the at least one heat dissipating pad. Accordingly, the heat dissipating efficiency of the light source module can be increased.

In addition, the components of the projecting apparatus of the present disclosure are arranged on the light combining plane and the light transmitting plane, which have an angle there-between that is within a range from 85 degrees to 95 degrees, so that the components of the projecting apparatus can be properly arranged in the frame to effectively control the shape and volume of the projecting apparatus.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A projecting apparatus, comprising:
   a frame including:
      a first frame portion; and
      a second frame portion including a partition connected to the first frame portion, two lateral boards respectively connected to two opposite sides of the partition, and a transverse beam that is arranged away from the partition and that connects the two lateral boards, wherein the frame has a light channel that allows the first frame portion and the partition to be in spatial communication with each other, and each of the two lateral boards has a guiding slot recessed in a portion thereof adjacent to the first frame portion;
   a light source module disposed on the first frame portion; and
   a microelectromechanical systems (MEMS) module disposed on the second frame portion and configured to transmit light that is emitted from the light source module and that travels through the light channel, wherein the MEMS module includes:
      a flexible circuit board;
      a first MEMS unit connected to the flexible circuit board and inserted into the guiding slots of the two lateral boards; and
      a second MEMS unit connected to the flexible circuit board and abutting against the two lateral boards and/or the transverse beam, wherein the first MEMS unit and the second MEMS unit have a predetermined angle there-between by the second frame portion.

2. The projecting apparatus according to claim 1, wherein the light source module defines a plurality of optical axes, and the projecting apparatus further includes:
   a light combining lens disposed on the first frame portion and located on the optical axes, wherein the light combining lens defines a light combining path that passes through the light channel; and
   a plurality of collimator lenses located between the light source module and the light combining lens, wherein the collimator lenses are spaced apart from each other and are respectively located on the optical axes.

3. The projecting apparatus according to claim 1, wherein the first MEMS unit includes:
   a first carrying board having two lateral portions respectively inserted into the guiding slots of the two lateral boards; and
   a first MEMS member assembled to the first carrying board and connected to the flexible circuit board.

4. The projecting apparatus according to claim 3, wherein the second MEMS unit includes:
   a second carrying board abutting against the two lateral boards and/or the transverse beam, wherein the first carrying board and the second carrying board are spaced apart from each other; and
   a second MEMS member assembled to the second carrying board and connected to the flexible circuit board, wherein a micro-mirror of the first MEMS member and a micro-mirror of the second MEMS member have the predetermined angle there-between by using the first carrying board and the second carrying board to be in cooperation with the second frame portion.

5. The projecting apparatus according to claim 1, wherein the flexible circuit board includes a main portion and an extension portion that is connected to the main portion, and wherein the main portion covers an outer side of one of the two lateral boards, and the extension portion curvedly extends from the main portion and is connected to the first MEMS unit and the second MEMS unit.

6. The projecting apparatus according to claim 1, wherein the first frame portion includes a carrier and a carrying bridge, the projecting apparatus further includes at least one collimator lens disposed on the carrier, and an end of the carrying bridge is connected to the carrier, wherein the frame has a processing slot that uses the carrying bridge as a bottom thereof, and the carrying bridge has at least one thru-hole that is in spatial communication with the processing slot, wherein the partition is connected to the carrier and another end of the carrying bridge, and the at least one collimator lens is located in the processing slot, and wherein the projecting apparatus further includes at least one adhesive corresponding in position to the at least one thru-hole, and the at least one collimator lens is adhered and fixed to the carrying bridge through the at least one adhesive.

7. The projecting apparatus according to claim 6, wherein the light source module defines a plurality of optical axes, and each of a quantity of the at least one thru-hole, a quantity of the at least one collimator lens, and a quantity of the at least one adhesive is more than one, wherein the adhesives are spaced apart from each other and respectively correspond in position to the thru-holes, and each of the collimator lenses is adhered and fixed to the carrying bridge through one of the adhesives, wherein the projecting apparatus further includes a light combining lens disposed on the first frame portion and located on the optical axes, and wherein the light combining lens defines a light combining path that passes through the light channel, the collimator lenses are located between the light source module and the light combining lens, and the collimator lenses are spaced apart from each other and are respectively located on the optical axes.

8. The projecting apparatus according to claim 7, wherein the carrying bridge includes a plurality of channel walls that respectively face the collimator lenses and that are respectively connected to walls of the thru-holes, and wherein each of the channel walls and the corresponding collimator lens jointly define a capillary channel that is in spatial communication with the corresponding thru-hole, and each of the adhesives is filled within one of the capillary channels.

9. The projecting apparatus according to claim 8, wherein the carrying bridge has a plurality of receiving slots recessed in a surface thereof away from the processing slot, and each of the thru-holes is recessed in a bottom of one of the receiving slots.

10. The projecting apparatus according to claim 9, wherein a center of the bottom of any one of the receiving slots does not overlap with a center of the corresponding thru-hole.

11. The projecting apparatus according to claim 2, wherein the optical axes and the light combining path jointly define a light combining plane, and the MEMS module is configured to reflect light, which travels along the light combining path, at a light transmitting plane, and wherein the light combining plane and the light transmitting plane have an angle there-between that is within a range from 85 degrees to 95 degrees.

12. The projecting apparatus according to claim 2, wherein the light source module includes:
 a light controlling flexible board having at least one accommodating hole;
 a complex light emitter disposed on the first frame portion and defining the optical axes, wherein the complex light emitter includes at least one heat dissipating pad and a plurality of signal pads, and wherein the signal pads are assembled to the light controlling flexible board; and
 a heat sink having a flat portion and at least one heat conductive portion that protrudes from the flat portion, wherein the flat portion is fixed to the light controlling flexible board, and the at least one heat conductive portion is connected to the at least one heat dissipating pad that passes through the at least one accommodating hole.

13. The projecting apparatus according to claim 1, wherein the MEMS module further includes two first fixing colloids respectively located in the guiding slots of the two lateral boards, and wherein each of the guiding slots of the two lateral boards is connected to a corresponding portion of the first MEMS unit fixed therein through one of the two first fixing colloids.

14. The projecting apparatus according to claim 13, wherein the MEMS module includes a second fixing colloid that fixes the second MEMS unit onto the transverse beam.

15. The projecting apparatus according to claim 8, wherein each of the channel walls corresponds in shape to the corresponding collimator lens, so that the capillary channels have a same width.

16. The projecting apparatus according to claim 2, further comprising a photodetector module disposed on the first frame portion, wherein the light combining lens is located between the photodetector module and the collimator lenses, and wherein the photodetector module is configured to receive light that is emitted from the light source module and that travels through the light combining lens and at least one of the collimator lenses.

17. The projecting apparatus according to claim 16, wherein the light source module includes a light controlling flexible board and a plurality of light emitting units that are assembled onto the light controlling flexible board, wherein the light controlling flexible board is electrically coupled to the photodetector module, and the light emitting units respectively define the optical axes, and wherein the light controlling flexible board is configured to adjust a lighting intensity of at least one of the light emitting units according to the light received by the photodetector module.

18. The projecting apparatus according to claim 2, wherein the frame is integrally formed as a single one-piece structure, and corners of the frame jointly define a distribution space, and wherein a part of the light source module, the light combining lens, the collimator lenses, and a part of the MEMS module are located in the distribution space.

19. The projecting apparatus according to claim 12, wherein the at least one heat conductive portion and a wall of the at least one accommodating hole have a gap there-between.

20. The projecting apparatus according to claim 12, wherein a same side for both the first frame portion and the second frame portion is defined as a user side, another side for both the first frame portion and the second frame portion is defined as a heat dissipating side, and the heat sink is located at the heat dissipating side.

* * * * *